US011320387B2

(12) United States Patent
Wunsch et al.

(10) Patent No.: US 11,320,387 B2
(45) Date of Patent: May 3, 2022

(54) STRUCTURE FACILITATING OPTICALLY CHECKING VIA FORMATION

(71) Applicant: International Business Machines Corporation, Armonk, NY (US)

(72) Inventors: Benjamin Wunsch, Mt. Kisco, NY (US); Sung-Cheol Kim, New York, NY (US); Stacey Gifford, Fairfield, CT (US); Joshua T. Smith, Croton-on-Hudson, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 649 days.

(21) Appl. No.: 16/203,195

(22) Filed: Nov. 28, 2018

(65) Prior Publication Data

US 2020/0166468 A1 May 28, 2020

(51) Int. Cl.
*G01N 21/95* (2006.01)
*H01L 21/66* (2006.01)
*H01L 21/68* (2006.01)

(52) U.S. Cl.
CPC ......... *G01N 21/9501* (2013.01); *H01L 21/68* (2013.01); *H01L 22/12* (2013.01); *G01N 2201/06113* (2013.01)

(58) Field of Classification Search
CPC ......... H01L 22/12; H01L 22/26; H01L 22/30; G01N 21/9501; H01J 37/32963
See application file for complete search history.

(56) References Cited

U.S. PATENT DOCUMENTS

| 6,930,782 B1* | 8/2005 | Yi ............................ B24B 21/04 356/504 |
| 9,651,498 B2 | 5/2017 | Barak et al. |
| 9,772,297 B2 | 9/2017 | Nicolaides et al. |
| 9,852,955 B2 | 12/2017 | Gehles et al. |
| 2005/0026310 A1* | 2/2005 | Zhao ........................ H01L 22/34 438/14 |
| 2006/0105539 A1* | 5/2006 | Kim ......................... H01L 22/34 438/425 |
| 2012/0032326 A1* | 2/2012 | Kim ...................... H01L 23/481 257/738 |

(Continued)

OTHER PUBLICATIONS

"Microfluidic Devices With Multiple Inlets and Outlets" U.S. Appl. No. 16/168,330, filed Oct. 23, 2018, 39 pages.

(Continued)

*Primary Examiner* — Alia Sabur
(74) *Attorney, Agent, or Firm* — Amin, Turocy & Watson, LLP

(57) ABSTRACT

Techniques regarding one or more structures for checking the via formation are provided. For example, one or more embodiments described herein can comprise an apparatus, which can comprise a microfluidic channel positioned on a silicon substrate. The apparatus can also comprise a pattern of material comprised within the microfluidic channel and positioned on a surface of the silicon substrate. Further, the pattern of material can define a future location of a through-silicon via. An advantage of such an apparatus can be that the pattern of material can facilitate checking whether the through-silicon via is fully or partially formed.

18 Claims, 11 Drawing Sheets

(56) References Cited

U.S. PATENT DOCUMENTS

| | | | |
|---|---|---|---|
| 2012/0091454 A1* | 4/2012 | Liang | H01L 22/12 |
| | | | 257/48 |
| 2015/0311129 A1 | 10/2015 | Miller et al. | |
| 2019/0120775 A1* | 4/2019 | Sawlani | G01N 21/95607 |
| 2019/0134627 A1* | 5/2019 | Burger | B01L 3/502715 |

OTHER PUBLICATIONS

"Single Layer Nanofluidic Separator Chip and Fluidic Processor" U.S. Appl. No. 15/815,846, filed Nov. 17, 2018. 29 pages.

Aiyer, Arun A., et al. "Optical Technologies for TSV Inspection." 25th Annual SEMI Advanced Semiconductor Manufacturing Conference (ASMC 2014). 11 pages.

Ku, Yi-Sha, et al. "Reflectometer-based metrology for high-aspect ratio via measurement." Optics Express, vol. 18, No. 7, Mar. 29, 2010. 12 pages.

\* cited by examiner

STRUCTURE FACILITATING OPTICALLY CHECKING VIA FORMATION

BACKGROUND

The subject disclosure relates to one or more structures to facilitate etch checking, and more specifically, to one or more structures that can facilitate optically checking the formation progress of one or more vias.

On-chip, integrated nanofluidic networks, such as massively parallel nanoscale deterministic lateral displacement ("nanoDLD") arrays, link thousands of fluidic devices together to process sample fluid in concert. This linking enables processing of larger volumes of sample at a fast rate, multiplexing and synching of several types of devices or running conditions, and/or incorporation of redundancy and in-system calibration. Device linking can occur either through networking of microchannels to each device on the same side of the chip or using through-silicon vias ("TSVs") to run channels from the backside to the frontside (device side) of the chip. This later case allows more sophisticated integration of fluidic networks, as well as more connections, due to the lifting of the geometric constraint of in-plane fluidics.

For technologies such as high-throughput nanoDLD, 100's to 10,000's of TSVs can be required to link all devices into a single, functioning network. This produces the fabrication challenge of ensuring that all TSVs have fully-formed; for any incomplete or malformed TSVs will alter the local fluidics, causing device malfunction or mis-calibration. In silicon nanoDLD, TSVs are generally produced by etch methods, such as deep reactive ion etching ("DRIE"), and the TSVs can be etched from the backside of the silicon wafer towards the front side (device side). Formation of the TSVs can generally occur at the end of the fabrication process, when the nanofluidic network has already been sealed (e.g., under a glass cover), making direct access to the front-end of the TSVs impossible.

Further, it is difficult to identify when the DRIE has fully etched the TSVs since silicon becomes transparent at about 40 micrometers (μm), making an optical inspection impossible. In some instances, TSVs that have failed to etch, and others that are only partially broken through, can result in pin-holes or constricted outlets. In addition, using scanning probes or invasive/destructive methods to probe TSV formation can be prohibitively expensive, or impossible due to constraints on sealing the etch-out side of the TSVs under a capping material to form a leak-proof fluidic network.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, apparatuses and/or methods regarding structures that can facilitate optical checking of one or more etch processes are described.

According to an embodiment, an apparatus is provided. The apparatus can comprise a microfluidic channel positioned on a silicon substrate. The apparatus can also comprise a pattern of material comprised within the microfluidic channel and positioned on a surface of the silicon substrate. Further, the pattern of material can define a future location of a through-silicon via. An advantage of such an apparatus can be that the pattern of material can facilitate checking whether the through-silicon via is fully or partially formed.

In some examples, the pattern of material can be optically distinguishable from the surface of the silicon substrate. An advantage of such an apparatus can be that the pattern of material can enable an optical inspection of the progress of an etch process even in instances where the silicon substrate is partially or fully transparent.

According to an embodiment, a method is provided. The method can comprise capturing, by a system operably coupled to a processor, an image of a first surface of a substrate. The method can also comprise comparing, by the system, the image to a reference image of a pattern of material to determine a formation progress of a via formed into the substrate. The via can extend from a second surface of the substrate towards the first surface. An advantage of such a method can be the enablement of autonomous inspection processes to enhance the quality control of via formation.

In some examples, the method can further comprise determining, by the system, that the pattern of material is at least partially present on the first surface based on the comparing. Additionally, the method can comprise determining, by the system, that the via is partially formed based on the determining that the pattern of material is at least partially present on the first surface. An advantage of such a method can be the use of non-destructive, optical inspections to determine whether a via has been fully or partially formed by one or more etching processes.

According to an embodiment, a method is provided. The method can comprise identifying a location on a substrate where a via will be formed. The method can also comprise fabricating a pattern of material at the location to form an etch check. A presence of the etch check on the substrate subsequent to an etching of the via into the substrate can indicate that the via is partially etched. An advantage of such a method can be the formation of a structure that can facilitate optical inspection of the via in the substrate.

In some examples, the method can further comprise lithographically defining the pattern of material in relief from the substrate. Also, the substrate can be a silicon substrate, and the via can be a through-silicon via. An advantage of such a method can be the fabrication of a structure for etch checking through-silicon vias in one or more microfluidic devices.

DETAILED DESCRIPTION

Figure 1:
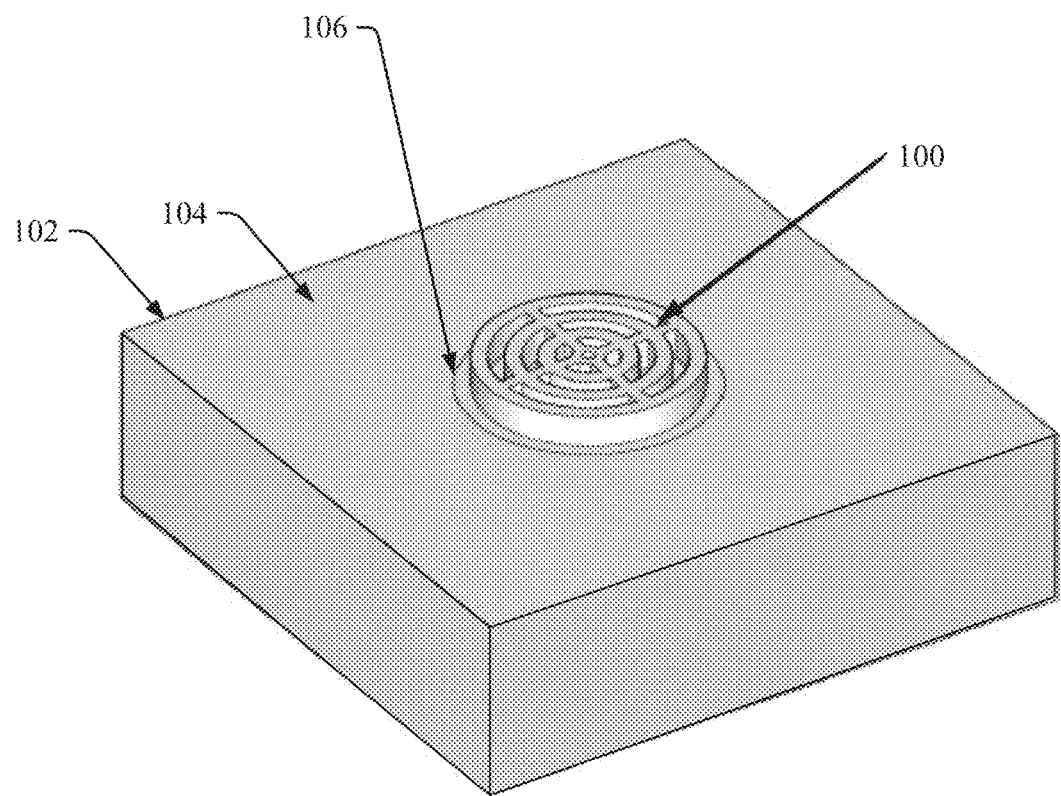
FIG. 1 illustrates a diagram of an example, non-limiting etch check that can facilitate determining whether a via has been fully formed in a substrate in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Given the above problems with conventional via formation; the present disclosure can be implemented to produce a solution to one or more of these problems in the form of one or more etch checks that can facilitate an optical inspection to determine whether a via is partially or fully formed. For example, the one or more etch checks described herein can be used to monitor the etching of TSVs in nanofluidic networks, wherein the one or more etch checks can comprise lithographically defined patterns of material. At least partial presence of the one or more etch checks on a substrate (e.g., a silicon substrate) after formation of a via (e.g., the attempted formation of a TSV) can indicate that the subject via is only partially formed. Further, the one or more etch checks can be optically distinguishable from the substrate upon which they are located, thereby facilitating an optical inspection of via formation. In addition, methods regarding the fabrication and/or use of the one or more etch checks are also described herein. Advantageously, the one or more etch checks can be resolved by microscopes and/or digital optics; thereby allowing non-destructive, rapid inspection of via formation. In other words, the one or more etch checks enable a user and/or system to inspect for via formation optically, and then send subject the via to additional etching if needed, without destructive and/or contaminative testing. Thus, various embodiments described herein can: provide a robust, quantifiable, optical analysis of via formation; be performed under unique constraints, such as constraints associated with on-chip nanofluidic networks; be formed concurrent with fluidic networks using lithography technology; and/or allow for recovery of incomplete devices by further etching processes.

As used herein, the term "via" can refer to one or more holes extending through a substrate, from one side of a substrate to another side of the substrate. For example, the substrate can be a silicon substrate (e.g., a silicon wafer) and the via can be an empty TSV. Vias can facilitate various functions such as fluidic and/or electrical communication between device features. For instance, one or more vias described herein can facilitate fluidic communication between a plurality of features in a microfluidic device (e.g., comprising a nanofluidic network, such as a plurality of nanoDLD arrays).

As used herein, the term "partially formed via" can refer to a via that does not fully extend through the entire thickness of a substrate, and/or a via having a dimension at one side of the substrate that is less than the dimension at another side of the substrate. An example partially formed via can include a via that extends from one side of a substrate towards another side of the substrate but fails to reach the other side at least because it extends to length less than the thickness of the substrate. Another example partially formed via can include a via that extends from a first side of a substrate, through the entire thickness of the substrate, and to a second side of the substrate; but a diameter of the partially formed via at the second side is less than the diameter of the partially formed via at the first side by a defined threshold (e.g., greater than or equal to 1 percent and less than or equal to 10 percent). Thus, partially formed vias can be vias that failed to etch completely through a substrate, and/or vias that have etched completely through the substrate but have only partially consumed a desired substrate area for via formation (e.g., vias commonly referred to as a "pin-holes").

As used herein, the term "fully formed via" can refer to a via that extends from a first side of the substrate to a second side of the substrate (e.g., completely through a thickness of the given substrate that defines the via) and has dimensions at the first side that are equal to the dimensions at the second side within a defined tolerance (e.g., greater than or equal to 0.1 percent of variation and less than or equal to 5 percent of variation). An example fully formed via can include a via that has been etched completely through a substrate, wherein the etching has consumed a substantial entirety of a desired substrate area for the via's formation.

As used herein, the term "etch process" can refer to one or more etching techniques that can remove substrate material and/or form one or more vias. Example etch processes can include, but are not limited to: reactive-ion etching ("RIE"), DRIE, wet etching, dry etching, plasma etching, sputter etching, a combination thereof, and/or the like.

FIG. 1 illustrates a diagram of an example, non-limiting etch check 100 that can be positioned on a substrate 102 to facilitate monitoring via formation within the substrate 102. The substrate 102 can comprise materials that can be etched by one or more etching processes to form one or more vias. Additionally, the substrate 102 can provide support for one or more devices positioned adjacent to the substrate 102. One or more vias extending through the substrate 102 can facilitate communication (e.g., fluid communication) between a plurality of devices located adjacent to the substrate 102. Example materials that can comprise the substrate can include, but are not limited to: silicon, silicon dioxide, silicon nitride, a combination thereof, and/or the like. For instance, in one or more embodiments the substrate 102 can comprise silicon and can thereby be a silicon substrate (e.g., a silicon wafer). Further one or more vias, defined by the substrate 102 can be TSVs.

The etch check 100 can be a pattern of material positioned on a first side 104 of the substrate 102 and/or can be confined within a via formation area 106. The via formation area 106 can be the future location of via. In other words, the via formation area 106 can define a volume of substrate material that will be etched out (e.g., by one or more etching processes) to form a via (e.g., a TSV). In one or more embodiments, the via formation area 106 can have an exemplary diameter that is greater than or equal to 10 μm and less than or equal to 500 μm. While FIG. 1 depicts a circular via formation area 106, the architecture of the via formation area 106 is not so limited (e.g., polygonal via formation areas 106 are also envisaged). The etch check 100 can positioned within the via formation area 106 on the first side of the substrate 102 to facilitating optical monitoring of formation of the subject via to be formed in the via formation area 106.

In one or more embodiments, the etch check 100 can be lithographically defined onto the first side 104 of the substrate 102. For example, the etch check 100 can be a relief formed from the substrate 102 by one or more lithography techniques (e.g., photolithography, non-contact lithography, electron beam lithography, laser micro-machining, a combination thereof, and/or the like). For instance, substrate material from the substrate 102 can be removed from the first side 104 by one or more lithography techniques to form one or more etch checks 100; thereby, the etch check 100 can be a relief sculpted (e.g., by one or more lithography techniques) from the substrate 102. Thus, in one or more embodiments, the etch check 100 can be a lithographically defined relief of substrate material. Thus, the etch check 100 can comprise the same, or substantially the same, composition as the substrate 102.

Additionally, in various embodiments, the etch check 100 can be defined into the first side 104 of the substrate 102 (not shown). For example, in contrast to extending out from the substrate 102 (e.g., as depicted in FIG. 1), the etch check 100 can be extend into the substrate 102. For instance, the etch check 100 can comprise a pattern of material defined by one or more trenches within the substrate 102. Thus, the etch check 100 can comprise the same, or substantially the same, composition as the substrate 102.

Further, the etch check 100 can be optically distinguishable from the first side 104 of the substrate 102. For example, contrast differences caused by the thickness (e.g., along the "Y" axis) and/or edge contours of the etch check 100 as compared to the first side of the substrate 102 can render the etch check 100 optically visible while positioned on the substrate 102. In one or more embodiments, the substrate 102 can be partially or fully transparent (e.g., at least partially due to a thinness of the substrate 102); however, edge contours of the etch check 100 can render the etch check 100 optically visible. Even wherein the etch check 100 comprises the same, or substantially same, composition as the transparent (e.g., partially transparent or fully transparent) substrate 102, the edge contours of the etch check 100 can render the etch check 100 optically visible (e.g., due at least to light refraction, light reflection, and/or shadows).

In various embodiments, the etch check 100 can facilitate determining whether a via is a fully formed via or a partially formed via. When a via is etched into the substrate 102 (e.g., one or more etching processes) corresponding to the via formation area 106, an absence of the etch check 100 on the substrate 102 subsequent to the etching can be indicative that the subject via is fully formed. For example, wherein the via is a fully formed via, the one or more etching processes that formed the via can also remove the etch check 100 from the substrate 102. For instance, wherein the via is a fully formed via, the one or more etching processes can etch completely through a thickness of the substrate (e.g., along the "Y" axis) and remove all, or substantially all, of the substrate material within the via formation area 106, including the etch check 100 positioned at the via formation area 106.

In contrast, when a via is etched into the substrate 102 (e.g., by one or more etch processes) corresponding to the via formation area 106, at least partial presence of the etch check 100 on the substrate 102 subsequent to the etching can be indicative that the subject via is a partially formed via. For example, wherein the via is a partially formed via, the one or more etching process that formed the via can fail to reach the first side 104 of the substrate 102, and thereby can fail to reach the etch check 100. For instance, the via can extend from another side of the substrate 102 opposite the first side 104 into the substrate 102 a distance that is less than the thickness (e.g., along the "Y" axis) of the substrate 102. In another example, wherein the via is a partially formed via, the one or more etching process that formed the via can reach the first side 104 of the substrate 102 but only remove a portion of the of the substrate material in the via formation area 106; thereby, at least a portion of the substrate material in the via formation area 106 can remain, including at least a portion of the etch check 100.

Therefore, the first side 104 of the substrate 102 can be optically inspected subsequent to formation of a via within the substrate 102 to determine whether the subject via is a partially formed via or a fully formed via. Wherein the visual absence of the etch check 100 from the first side 104 of the substrate 102 can indicate that the via is fully formed, and the visual presence (e.g., at least partial presence) of the etch check 100 on the first side 104 of the substrate 102 can indicate that the via is partially formed. Advantageously, monitoring the state of the etch check 100 can be performed optically, thereby negating inspection processes that can result in destruction and/or contamination of a device comprising the subject one or more vias.

As shown in FIG. 1, the etch check 100 can comprise one or more patterns of material. Further, the patterns can define the via formation area 106 into one or more sectors. By defining one or more sectors in the via formation area 106, the etch check 100 can enable partial etching (e.g., the formation of a partially formed via) to be indicated and/or quantified by the location and/or extend of sectors removed by the one or more etching processes. For example, the etch check 100 can act as an on-substrate ruler to measure the extent to which the via (e.g., a TSV) has etched through the substrate 102, in cases where the etching can be non-uniform across the via formation area 106.

In one or more embodiments, the etch check 100 can comprise a periodic pattern of material (e.g., forming diffraction grating and/or photonic crystal structures). Also, the etch check 100 can comprise a pattern that can be readily identifiable by image analysis software. In one or more embodiments, widths of the patterns comprising the etch check 100 can be dependent on the resolution of an optical system used to monitor the etch check 100. For example, one or more patterns within the etch check 100 can have widths greater than or equal to 0.0.1 μm and less than or equal to 100 μm.

In various embodiments, the etch check 100 can be autonomously imaged and/or analyzed by a digital camera and/or computer system. Further, automated image detection of the etch check 100 can be done after the substrate 102 is etched or in situ during the one or more etching processes, thereby enabling direct feedback during manufacturing of a subject device. In one or more embodiments, light can be shown from behind the substrate 102 into the subject via to allow illumination and/or resolution of the etch check 100.

Figure 2:
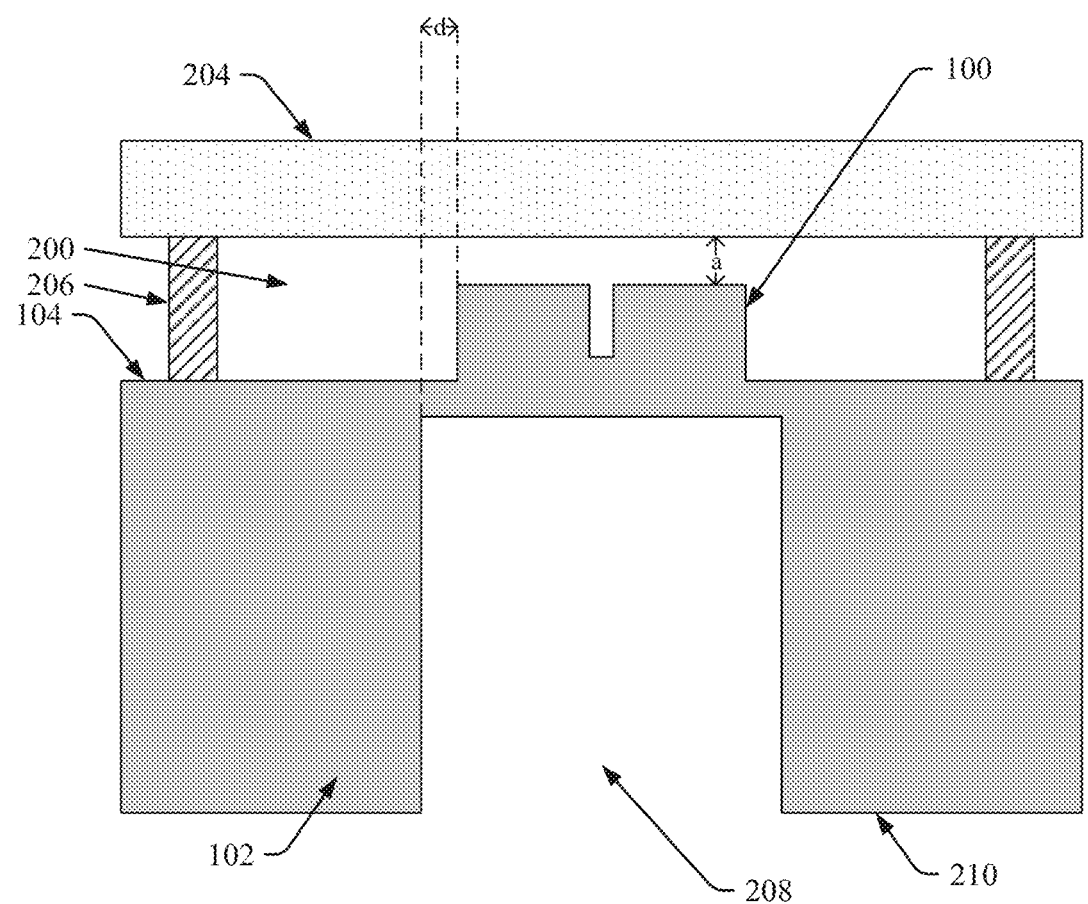
FIG. 2 illustrates a diagram of an example, non-limiting cross-sectional view of an etch check that can be formed in a microfluidic channel to check the formation of one or more microfluidic vias in accordance with one or more embodiments described herein.

FIG. 2 illustrates a diagram of an example, non-limiting cross-sectional view of an etch check 100 comprised within a microfluidic channel 200, which can facilitate fluid communication between a plurality of microfluidic devices in accordance with one or more embodiments described herein. Repetitive description of like elements employed in other embodiments described herein is omitted for sake of brevity. FIG. 2 depicts an exemplary embodiment in which the etch check 100 can be utilized to facilitate optical monitoring of via formation in a microfluidic device.

As shown in FIG. 2, the microfluidic channel 200 can be disposed on the first side 104 of the substrate 102. Further, sealing layer 204 can be supported over the microfluidic channel 200 and/or the substrate 102 by one or more support structures 206. The sealing layer 204 can define one or more dimensions of the microfluidic channel 200 (e.g., the height of the microfluidic channel 200 along the "Y" axis). Further, the sealing layer 204 be at least partially transparent to facilitate optical monitoring of the etch check 100. Example materials that can comprise the sealing layer 204 can include, but are not limited to: glass, transparent conductive oxide, quartz, plastic, elastomers, composites, a combination thereof, and/or the like. In one or more embodiments, the sealing layer 204 can form the mechanical sealing of the microfluidic channel 200 to facilitate fluid containment. As shown in FIG. 2, the sealing layer 204 and/or the substrate 102 can encapsulate the one or more microfluidic channels 200 and/or the one or more etch checks 100.

Additionally, the one or more support structures 206 can provide structural support to the sealing layer 204 and/or further define one or more dimensions of the microfluidic channel 200 (e.g., the width of the microfluidic channel 200 along the "X" axis). The one or more support structures 206 can comprise the same, or substantially the same, composition as the substrate 102, or the one or more support structures 206 can comprise a different composition than the substrate 102 (e.g., as shown in FIG. 2).

The microfluidic channel 200 can be formed by fixing the sealing layer 204 to the one or more support structures 206 prior to etching one or more microfluidic vias 208. In one or more embodiments, the substrate 102 can be a silicon substrate and/or the one or more microfluidic vias 208 can be TSVs. Thus, the one or more microfluidic vias 208 can be formed by etching a second side of the substrate 210, wherein the second side 210 can be opposite the first side 104 (e.g., as shown in FIG. 2). Therefore, the one or more microfluidic vias 208 can extend from the second side 210 of the substrate 102 towards the etch check 100 positioned on the first side 104 of the substrate 102.

FIG. 2 also exemplifies that the etch check 100 can be confined within the via formation area 106. For instance, the etch check 100 can be confined to a surface area within the via formation area 106 that is offset from the bounds of the via formation area 106 by a defined threshold. In other words, the etch check 100 can be confined to a surface area within the via formation area 106 that is less than the surface area of the via formation area 106. For example, FIG. 2 delineates the offset between the boundary of the etch check 100 and the boundary of the via formation area 106 with the "d" arrow. The offset (e.g., represented by the "d" arrow in FIG. 2) can be, for example, greater than or equal to 0.1 μm and less than or equal to 10 μm. Further, the offset (e.g., represented by the "d" arrow in FIG. 2) can ensure that all of the etch check 100 can be removed during the formation of a fully formed via (e.g., a fully formed microfluidic via 208).

Additionally, FIG. 2 exemplifies that a clearance can exist between the etch check 100 and one or more adjacent surface structures, other than the substrate 102, to prevent the etch check 100 from bonding, and/or otherwise contacting, the adjacent surfaces. For example, FIG. 2 delineates the clearance between the etch check 100 and the sealing layer 204 with the "a" arrow. The clearance between the etch check 100 and one or more adjacent surface structures, other than the substrate 102, can be for example, greater than or equal to 0.1 μm and less than or equal to 10 μm.

Figure 3:
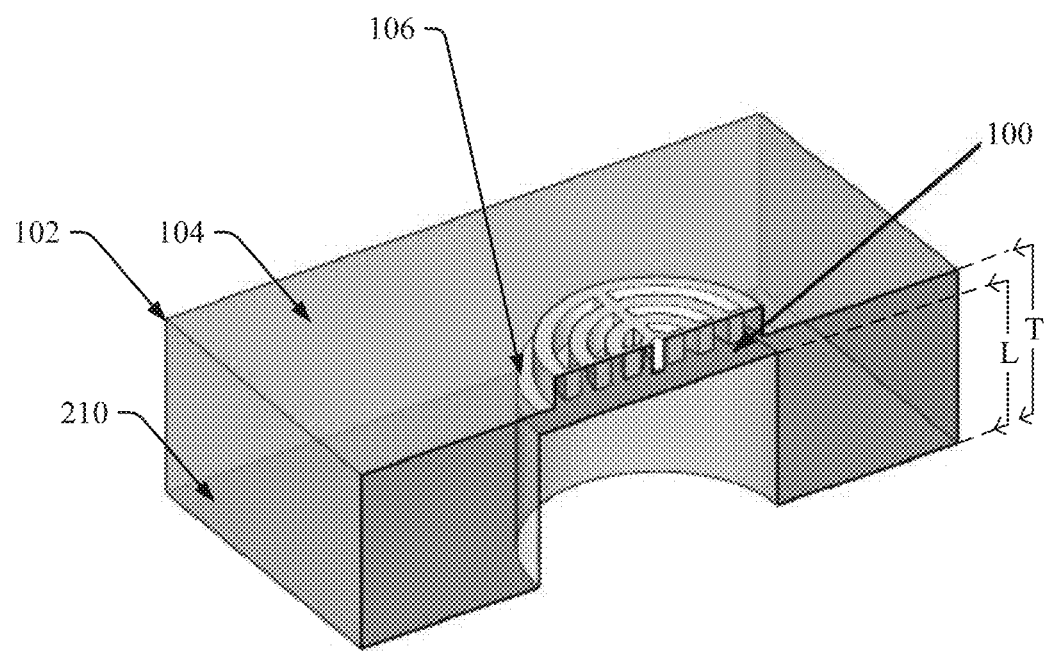
FIG. 3 illustrates a diagram of an example, non-limiting etch check that can facilitate determining whether a via has been fully formed in a substrate in accordance with one or more embodiments described herein.

FIG. 3 illustrates a diagram of an example, non-limiting cross-sectional view of an etch check 100 positioned on a substrate 102, wherein the substrate 102 is semitransparent to depict on or more features of the etch check 100, in accordance with one or more features described herein. Repetitive description of like elements employed in other embodiments described herein is omitted for sake of brevity. Further, FIG. 3 can depict an exemplary partially formed via 302 within the substrate 102.

For instance, FIG. 3 can depict the exemplary partially formed via 302 extending from the second side of the substrate 210 into the substrate 102 along an area corresponding to the via formation area 106 towards the first side 104 of the substrate 102. As shown in FIG. 3, the exemplary partially formed via 302 can have a length (e.g., represented by the "L" arrow in FIG. 3) that is less than the thickness of the substrate 102 (e.g., represented by the "T" arrow in FIG. 3). Thus, the one or more etching processes that formed the exemplary partially formed via 302 failed to etch entirely through the substrate 102, and as such did not reach the etch check 100. Therefore, the etch check 100 can remain present on the first side 104 of the substrate 102 subsequent to the etching (e.g., as shown in FIG. 3), and can thereby indicate that the exemplary partially formed via 302 is partially formed.

Figure 4A:
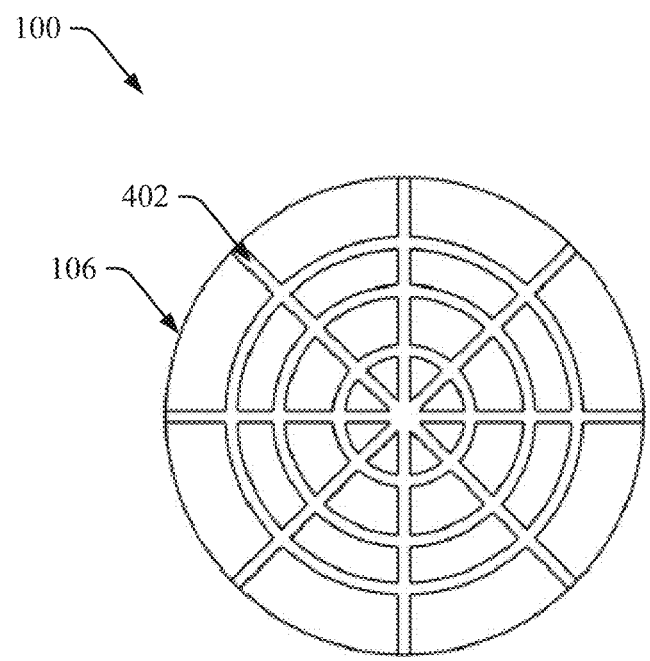
FIG. 4A illustrates a diagram of an example, non-limiting top-down view of a pattern that can characterize an etch check in accordance with one or more embodiments described herein.

FIG. 4A illustrates a diagram of an example, non-limiting top-down view of an exemplary first pattern 402 of material that can characterize the etch check 100 in accordance with one or more embodiments described herein. Repetitive description of like elements employed in other embodiments described herein is omitted for sake of brevity. As shown in FIG. 4A, the first pattern 402 can define the via formation area 106 into one or more sectors.

Figure 4B:
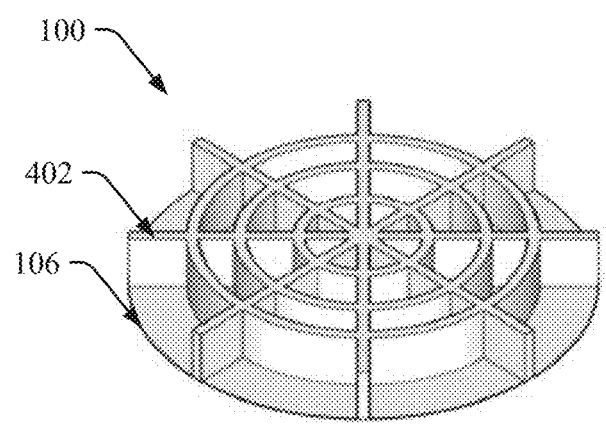
FIG. 4B illustrates a diagram of an example, non-limiting three-dimensional ("3D") view of a pattern that can characterize an etch check in accordance with one or more embodiments described herein.

Additionally, FIG. 4B illustrates a diagram of an example, non-limiting 3D view of the first pattern 402 of material that can characterize the etch check 100 in accordance with one or more embodiments described herein. Repetitive description of like elements employed in other embodiments described herein is omitted for sake of brevity. FIG. 4B can provide an alternate perspective of the first pattern 402 to increase clarity of the architecture.

Figure 5A:
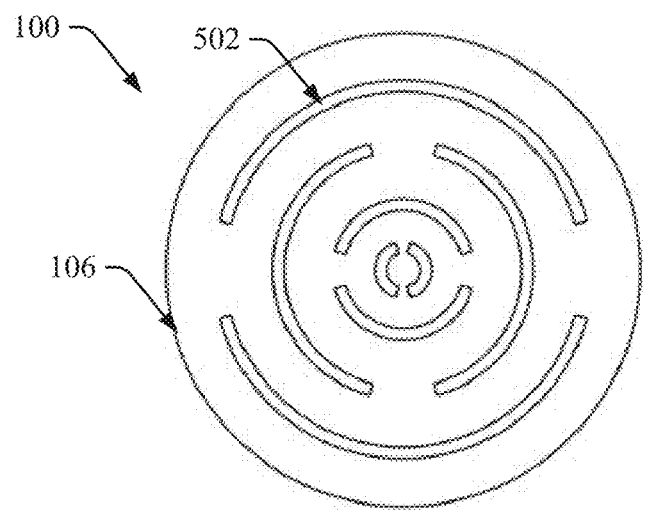
FIG. 5A illustrates a diagram of an example, non-limiting top-down view of a pattern that can characterize an etch check in accordance with one or more embodiments described herein.

FIG. 5A illustrates a diagram of an example, non-limiting top-down view of an exemplary second pattern 502 of material that can characterize the etch check 100 in accordance with one or more embodiments described herein. Repetitive description of like elements employed in other embodiments described herein is omitted for sake of brevity. As shown in FIG. 5A, the second pattern 502 can define the via formation area 106 into one or more sectors.

Figure 5B:
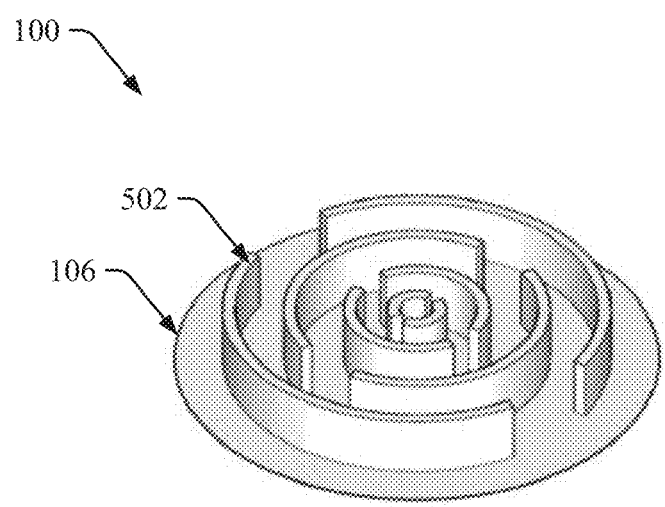
FIG. 5B illustrates a diagram of an example, non-limiting 3D view of a pattern that can characterize an etch check in accordance with one or more embodiments described herein.

Additionally, FIG. 5B illustrates a diagram of an example, non-limiting 3D view of the second pattern 502 of material that can characterize the etch check 100 in accordance with one or more embodiments described herein. Repetitive description of like elements employed in other embodiments described herein is omitted for sake of brevity. FIG. 5B can provide an alternate perspective of the second pattern 502 to increase clarity of the architecture.

Figure 6A:
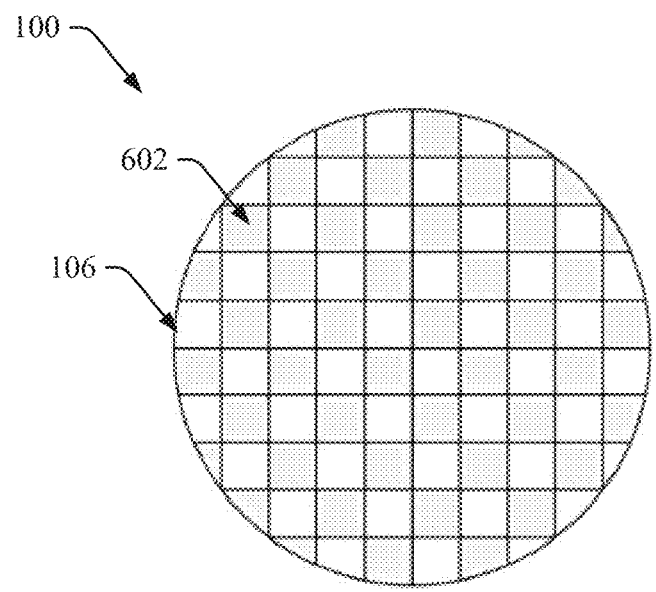
FIG. 6A illustrates a diagram of an example, non-limiting top-down view of a pattern that can characterize an etch check in accordance with one or more embodiments described herein.

FIG. 6A illustrates a diagram of an example, non-limiting top-down view of an exemplary third pattern 602 of material that can characterize the etch check 100 in accordance with one or more embodiments described herein. Repetitive description of like elements employed in other embodiments described herein is omitted for sake of brevity. As shown in FIG. 6A, the third pattern 602 can define the via formation area 106 into one or more sectors.

Figure 6B:
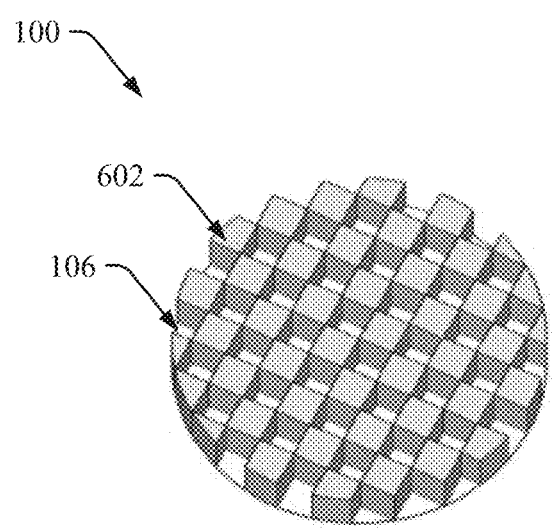
FIG. 6B illustrates a diagram of an example, non-limiting 3D view of a pattern that can characterize an etch check in accordance with one or more embodiments described herein.

Additionally, FIG. 6B illustrates a diagram of an example, non-limiting 3D view of the first pattern 402 of material that can characterize the etch check 100 in accordance with one or more embodiments described herein. Repetitive description of like elements employed in other embodiments described herein is omitted for sake of brevity. FIG. 6B can provide an alternate perspective of the third pattern 602 to increase clarity of the architecture.

Figure 7A:
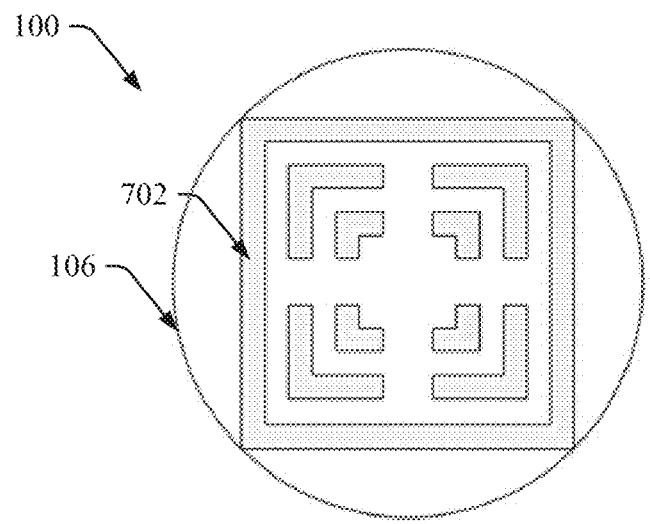
FIG. 7A illustrates a diagram of an example, non-limiting top-down view of a pattern that can characterize an etch check in accordance with one or more embodiments described herein.

FIG. 7A illustrates a diagram of an example, non-limiting top-down view of an exemplary fourth pattern 702 of material that can characterize the etch check 100 in accordance with one or more embodiments described herein. Repetitive description of like elements employed in other embodiments described herein is omitted for sake of brevity. As shown in FIG. 7A, the fourth pattern 702 can define the via formation area 106 into one or more sectors.

Figure 7B:
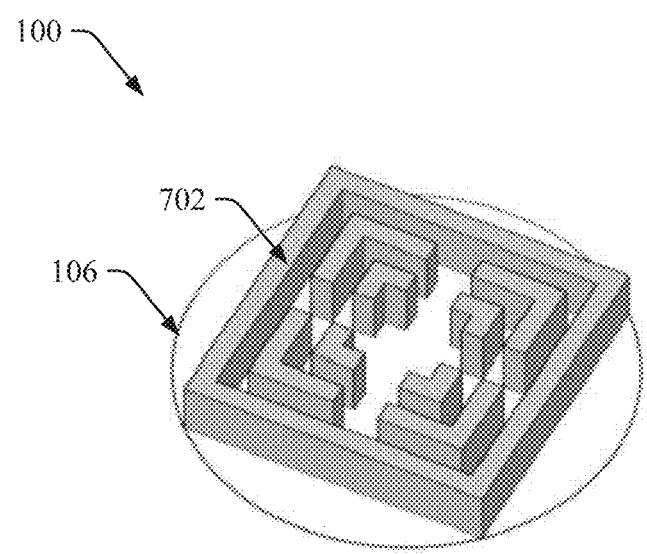
FIG. 7B illustrates a diagram of an example, non-limiting 3D view of a pattern that can characterize an etch check in accordance with one or more embodiments described herein.

Additionally, FIG. 7B illustrates a diagram of an example, non-limiting 3D view of the fourth pattern 702 of material that can characterize the etch check 100 in accordance with one or more embodiments described herein. Repetitive description of like elements employed in other embodiments described herein is omitted for sake of brevity. FIG. 7B can provide an alternate perspective of the fourth pattern 702 to increase clarity of the architecture.

One of ordinary skill in the art will recognize the architecture of the etch check 100 is not limited to the exemplary patterns depicted in FIGS. 1-7B (e.g., the pattern of material shown in FIGS. 1-3, the first pattern 402, the second pattern 502, the third pattern 602, and/or the fourth pattern 702). Rather, the patterns of material shown in FIGS. 1-7B are illustrated to exemplify one or more features of the etch check 100 described herein. Additional patterns of material formed from various geometries are also envisaged herein (e.g., including solid cylindrical and/or polygonal shapes).

Figure 8:
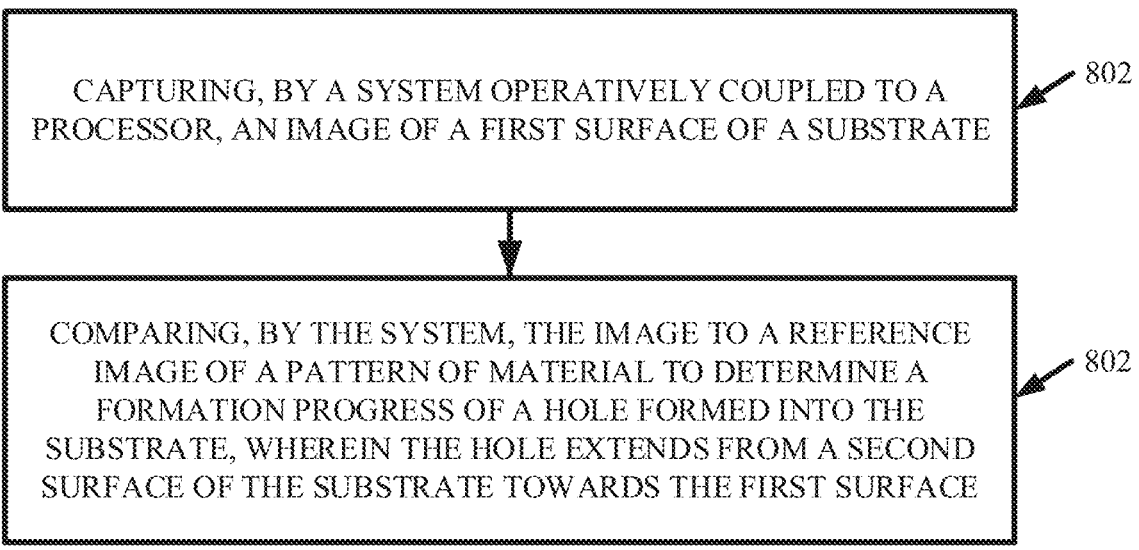
FIG. 8 illustrates a flow diagram of an example, non-limiting method that can facilitate optically inspecting a via using one or more etch checks in accordance with one or more embodiments described herein.

FIG. 8 illustrates a flow diagram of an example, non-limiting method 800 that can facilitate determining whether a via is a fully formed via or a partially formed via using one or more etch checks 100 in accordance with one or more embodiments described herein. Repetitive description of like elements employed in other embodiments described herein is omitted for sake of brevity.

At 802, the method 800 can comprise capturing, by a system operatively coupled to a processor, one or more images of a first surface (e.g., first side 104) of a substrate 102. For example, the system can comprise a digital camera operably coupled to the processor. In one or more embodiments, the capturing at 802 can be performed in accordance with one or more bright-field microscopy techniques.

At 804, the method 800 can comprise comparing, by the system, the image to a reference image of a pattern of material to determine a formation progress of a via formed into the substrate 102. The via can extend from a second surface (e.g., second side 210) of the substrate 102 towards the first surface. In one or more embodiments, the via can be a via formed into the substrate 102 using one or more etching processes. For instance, the substrate 102 can be a silicon substrate 102 and the via can be a TSV. Further, determining the formation progress can include determining whether the via is a partially formed via or a fully formed via.

The reference image of the pattern of material can be an image of one or more intact etch checks 100. Also, the reference image can be a digital image stored in a memory operably coupled to the processor. Prior to formation of the via, one or more etch checks 100 can be positioned on one or more via formation areas 106 on the first surface. Determining the formation progress of the via can be based on whether the etch check 100 remains optically visible on the first surface of the substrate 102 after one or more etching processes that form the via. The system can determine that the etch check 100 has remained optically visible post the one or more etching processes if the comparing at 804 identifies within the captured image at least a portion of the pattern of material shown in the reference image. In accordance with the various features described herein, if at least a portion of the etch check 100 remains optically visible (e.g., depicted within the image captured at 802) during the method 800, the system can determine that the via formed into the substrate 102 is a partially formed via. In contrast, if no portion of the etch check 100 remains optically visible (e.g., no portion is depicted within the image captured at 802) during the method 800, the system can determine that the via formed into the substrate 102 is a fully formed via.

One of ordinary skill in the art will recognize that the processor of the system can execute various image analysis software programs to facilitate method 800. Additionally, one or more cloud computing environments can be implemented by the system to increase computational efficiency and/or access images (e.g., captured images and/or reference images).

Figure 9:
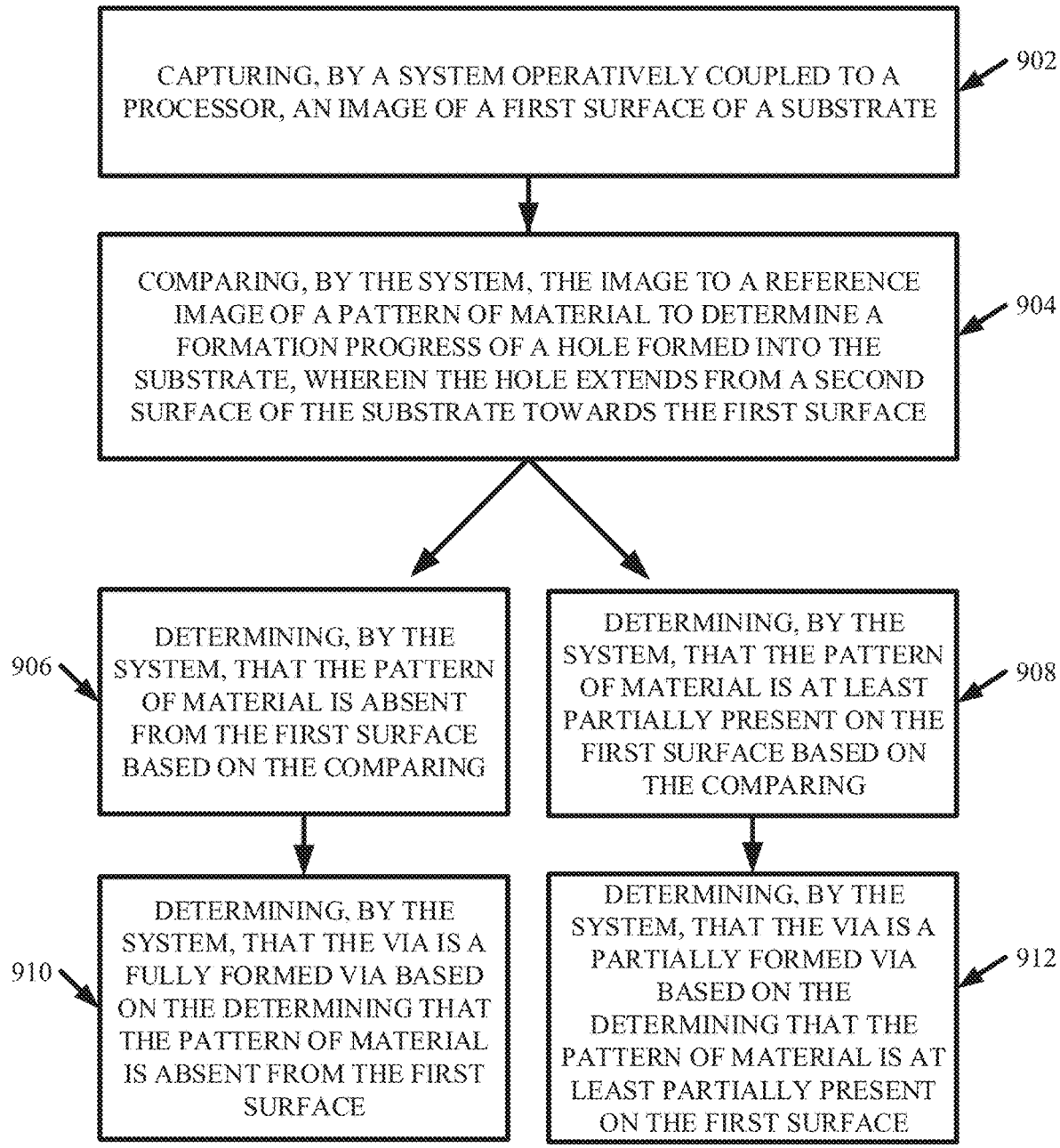
FIG. 9 illustrates a flow diagram of an example, non-limiting method that can facilitate optically inspecting a via using one or more etch checks in accordance with one or more embodiments described herein.

FIG. 9 illustrates a flow diagram of an example, non-limiting method 900 that can facilitate determining whether a via is a fully formed via or a partially formed via using one or more etch checks 100 in accordance with one or more embodiments described herein. Repetitive description of like elements employed in other embodiments described herein is omitted for sake of brevity. Prior to implementation of method 900, one or more etch checks 100 can be positioned on one or more via formation areas 106 of a subject substrate 102 in accordance with various embodiments described herein.

At 902, the method 900 can comprise capturing, by a system operatively coupled to a processor, one or more images of a first surface (e.g., first side 104) of a substrate 102. For example, the system can comprise a digital camera operably coupled to the processor. In one or more embodiments, the capturing at 802 can be performed in accordance with one or more bright-field microscopy techniques.

At 904, the method 900 can comprise comparing, by the system, the image to a reference image of a pattern of material to determine a formation progress of a via formed into the substrate 102. The via can extend from a second surface (e.g., second side 210) of the substrate 102 towards the first surface. In one or more embodiments, the via can be a via formed into the substrate 102 using one or more etching processes. For instance, the substrate 102 can be a silicon substrate 102 and the via can be a TSV. Further, determining the formation progress can include determining whether the via is a partially formed via or a fully formed via. The reference image of the pattern of material can be an image of one or more intact etch checks 100. Also, the reference image can be a digital image stored in a memory operably coupled to the processor. As a result of the comparing at 904, the method 900 can proceed to 906 or 908.

At 906, the method 900 can comprise determining, by the system, that the pattern of material is absent from the first surface (e.g., the first side 104) of the substrate 102 based on the comparing at 904. For example, the system can determine that the image captured at 902 does not comprise any portion of the one or one more patterns of material depicted in the reference image. Upon determining that the pattern of material is absent from the first surface, the method 900 can proceed to 910.

At 910, the method 900 can comprise determining, by the system, that the via is a fully formed via based on the determining that the pattern of material is absent from the first surface. For example, the one or more etching processes that formed the via into the substrate 102 can extend through the thickness of the substrate 102 and encompass the entirety, or substantial entirety, of the via formation area 106, thereby etching away the one or more etch checks 100 characterized by the one or more patterns of material depicted in the reference image. Thus, complete removal of the etch checks 100 by the one or more etching processes can indicate that that the one or more vias are fully formed vias, and/or can determined based on the optical comparison performed at 904.

In contrast at 908, the method 900 can comprise determining, by the system, that the pattern of material is at least partially present on the first surface (e.g., the first side 104) of the substrate 102 based on the comparing at 904. For example, the system can determine that the image captured at 902 does comprise at least a portion of the one or more patterns of material depicted in the reference image. Upon determining, that the pattern of material is at least partially present on the first surface, the method 900 can proceed to 912.

At 912, the method 900 can comprise determining, by the system, that the via is a partially formed via based on the determining that the pattern of material is at least partially present on the first surface (e.g., the first side 104) of the substrate 102. For example, the one or more etching processes that formed the via into the substrate 102 can fail to etch through the entire thickness of the substrate and/or can fail to etch away the entire, or substantially entire, volume of substrate material comprised within the via formation area 106. In either instance, the one or more etching processes can fail to etch away at least a portion of the one or more etch checks 100 characterized by the one or more patterns of material depicted in the reference image. Thus, at least partial presence of the one or more etch checks 100 subsequent to the one or more etching process can indicate that the one or more vias are partially formed vias, and/or can be determined base on the optical comparison performed at 904.

Figure 10:
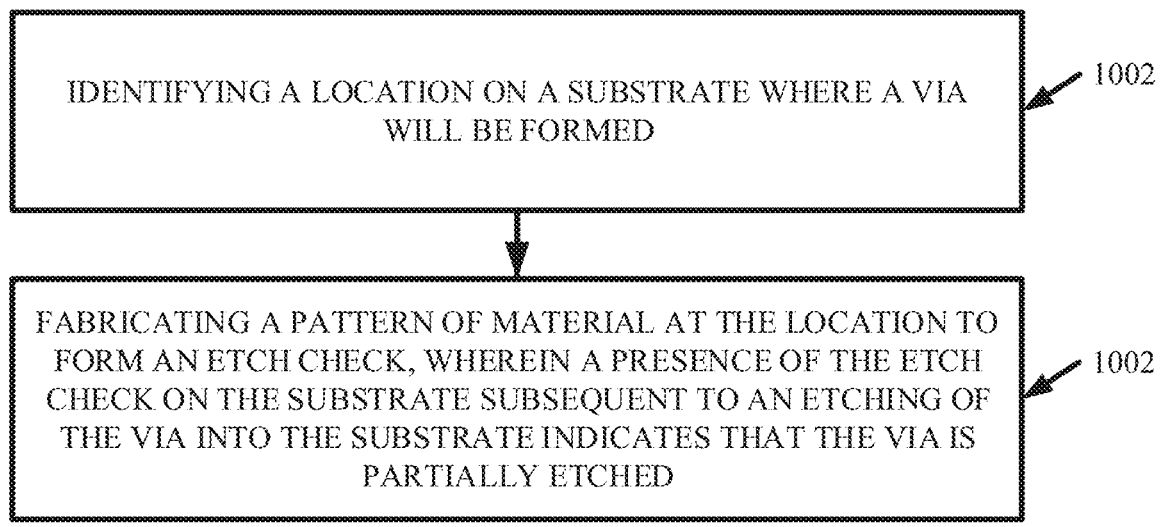
FIG. 10 illustrates a flow diagram of an example, non-limiting method that can facilitate fabrication of an etch check on a substrate in accordance with one or more embodiments described herein.

FIG. 10 illustrates a diagram of an example, non-limiting method 1000 that can regard formation of one or more etch checks 100 to facilitate optical monitoring of via formation within a substrate 102 in accordance with one or more embodiments described herein. Repetitive description of like elements employed in other embodiments described herein is omitted for sake of brevity.

At 1002, the method 1000 can comprise identifying a location on a substrate 102 where a via can be formed. For example, the identifying at 1002 can comprise determining one or more via formation areas 106. For instance, the one or more via formation areas 106 can be identified at one or more locations on the substrate 102 where a via would facilitate communication (e.g., fluid communication) between one or more devices (e.g., between one or more fluid devices, such as: microfluidic channels 200, nanoDLD arrays, a combination thereof, and/or the like). In one or more embodiments, the identifying at 1002 can comprise determining one or more via formation areas 106 within a microfluidic device and/or a microfluidic channel 200 (e.g., as depicted in FIG. 3).

At 1004, the method 1000 can comprise fabricating one or more pattern of materials at the location to form one or more etch checks 100, wherein a presence of the one or more etch checks 100 on the substrate 102 subsequent to an etching (e.g., by one or more etching processes) of the via into the substrate 102 can indicate that the via is partially etched (e.g., can indicate that the via is a partially formed via). For example, the one or more etch checks 100 can be fabricated at 1004 in accordance with the various features described herein with regards to FIGS. 1-7B.

For instance, the one or more patterns of material comprising the one or more etch checks 100 can be lithographically defined on the substrate 102. In one or more embodiments, the fabricating at 1004 can comprise lithographically defining one or more reliefs from the substrate 102 to form the one or more patterns of material that can characterize the one or more etch checks 100. Further, in various embodiments, the fabricating at 1004 can comprise lithographically defining one or more trenches into to the substrate 102 to form the one or more patterns of material that can characterize the one or more etch checks 100.

The one or more patterns of materials fabricated at 1004 can characterize the one or more etch checks 100, wherein the edge contours of the one or more patterns can visually distinguish the one or more etch checks 100 from the substrate 102. For example, even wherein the substrate 102 and/or the one or more etch checks 100 comprise transparent materials (e.g., partially transparent or fully transparent materials), the edge contours of the of one or more patterns of material can be remain visible to microscopes and/or digital optics. Additionally, the one or more etch checks 100 fabricated by method 1000 can be utilized in conjunction with one or more optical inspection methods (e.g., method 800 and/or method 900) to autonomously determine the progress of via formation within the substrate 102.

Figure 11:
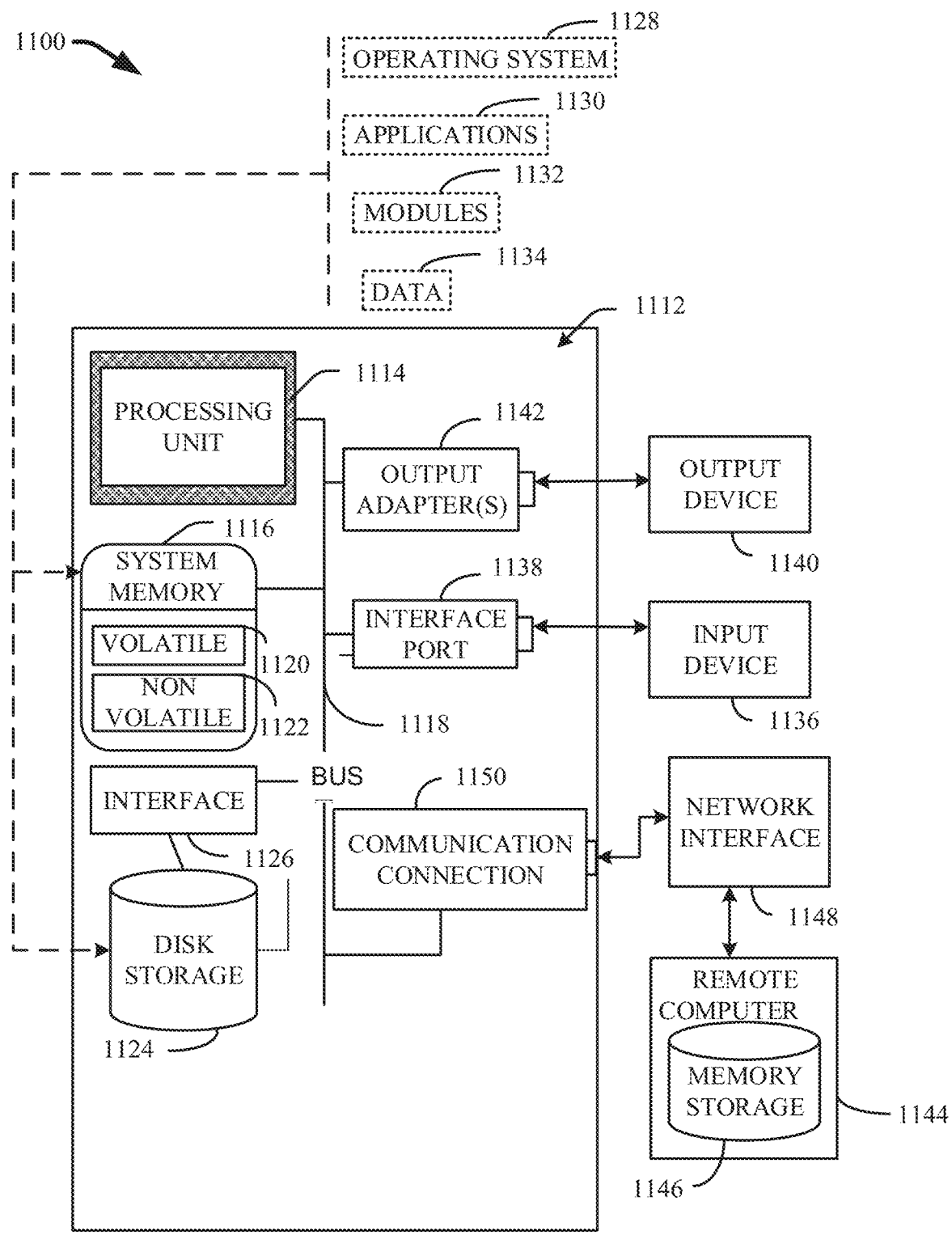
FIG. 11 illustrates a block diagram of an example, non-limiting operating environment in which one or more embodiments described herein can be facilitated.

In order to provide a context for the various aspects of the disclosed subject matter, FIG. 11 as well as the following discussion are intended to provide a general description of a suitable environment in which the various aspects of the disclosed subject matter can be implemented. FIG. 11 illustrates a block diagram of an example, non-limiting operating environment 1100 in which one or more embodiments described herein can be facilitated. Repetitive description of like elements employed in other embodiments described herein is omitted for sake of brevity. For example, the one or more systems described herein can comprise one or more features of the operating environment 1100 depicted in FIG. 11. With reference to FIG. 11, a suitable operating environment 1100 for implementing various aspects of this disclosure can include a computer 1112. The computer 1112 can also include a processing unit 1114, a system memory 1116, and a system bus 1118. The system bus 1118 can operably couple system components including, but not limited to, the system memory 1116 to the processing unit 1114. The processing unit 1114 can be any of various available processors. Dual microprocessors and other multiprocessor architectures also can be employed as the processing unit 1114. The system bus 1118 can be any of several types of bus structures including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire, and Small Computer Systems Interface (SCSI). The system memory 1116 can also include volatile memory 1120 and nonvolatile memory 1122. The basic input/output system (BIOS), containing the basic routines to transfer information between elements within the computer 1112, such as during start-up, can be stored in nonvolatile memory 1122. By way of illustration, and not limitation, nonvolatile memory 1122 can include read only memory (ROM), programmable ROM (PROM), electrically programmable ROM (EPROM), electrically erasable programmable ROM (EEPROM), flash memory, or nonvolatile random-access memory (RAM) (e.g., ferroelectric RAM (FeRAM). Volatile memory 1120 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1112 can also include removable/non-removable, volatile/non-volatile computer storage media. FIG. 11 illustrates, for example, a disk storage 1124. Disk storage 1124 can also include, but is not limited to, devices like a magnetic disk drive, floppy disk drive, tape drive, Jaz drive, Zip drive, LS-100 drive, flash memory card, or memory stick. The disk storage 1124 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1124 to the system bus 1118, a removable or non-removable interface can be used, such as interface 1126. FIG. 11 also depicts software that can act as an intermediary between users and the basic computer resources described in the suitable operating environment 1100. Such software can also include, for example, an operating system 1128. Operating system 1128, which can be stored on disk storage 1124, acts to control and allocate resources of the computer 1112. System applications 1130 can take advantage of the management of resources by operating system 1128 through program modules 1132 and program data 1134, e.g., stored either in system memory 1116 or on disk storage 1124. It is to be appreciated that this disclosure can be implemented with various operating systems or combinations of operating systems. A user enters commands or information into the computer 1112 through one or more input devices 1136. Input devices 1136 can include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices can connect to the processing unit 1114 through the system bus 1118 via one or more interface ports 1138. The one or more Interface ports 1138 can include, for example, a serial port, a parallel port, a game port, and a universal serial bus (USB). One or more output devices 1140 can use some of the same type of ports as input device 1136. Thus, for example, a USB port can be used to provide input to computer 1112, and to output information from computer 1112 to an output device 1140. Output adapter 1142 can be provided to illustrate that there are some output devices 1140 like monitors, speakers, and printers, among other output devices 1140, which require special adapters. The output adapters 1142 can include, by way of illustration and not limitation, video and sound cards that provide a means of connection between the output device 1140 and the system bus 1118. It should be noted that other devices and/or systems of devices provide both input and output capabilities such as one or more remote computers 1144.

Computer 1112 can operate in a networked environment using logical connections to one or more remote computers, such as remote computer 1144. The remote computer 1144 can be a computer, a server, a router, a network PC, a workstation, a microprocessor based appliance, a peer device or other common network node and the like, and typically can also include many or all of the elements described relative to computer 1112. For purposes of brevity, only a memory storage device 1146 is illustrated with remote computer 1144. Remote computer 1144 can be logically connected to computer 1112 through a network interface 1148 and then physically connected via communication connection 1150. Further, operation can be distributed across multiple (local and remote) systems. Network interface 1148 can encompass wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). One or more communication connections 1150 refers to the hardware/software employed to connect the network interface 1148 to the system bus 1118. While communication connection 1150 is shown for illustrative clarity inside computer 1112, it can also be external to computer 1112. The hardware/software for connection to the network interface 1148 can also include, for exemplary purposes only, internal and external technologies such as, modems including regular telephone grade modems, cable modems and DSL modems, ISDN adapters, and Ethernet cards.

Embodiments of the present invention can be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of various aspects of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to customize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device including, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components including a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems, computer program products and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus, comprising:
   a microfluidic channel positioned on a silicon substrate; and
   a pattern of material comprised within the microfluidic channel and positioned on a surface of the silicon substrate, wherein the pattern of material is aligned with and formed within the formation area defines a location of a through-silicon via, wherein the pattern of material is optically visible against the surface of the silicon substrate based on contrast differences caused by thickness and edge contours of the pattern as compared to the surface of the silicon substrate, and wherein the through-silicon via extends through a second surface of the silicon substrate towards the pattern of material.

2. The apparatus of claim 1, wherein the pattern of material is lithographically defined from the silicon substrate, and wherein the silicon substrate is transparent.

3. The apparatus of claim 2, wherein the pattern of material is a relief formed from the silicon substrate.

4. The apparatus of claim 2, wherein the pattern of material is etched into the silicon substrate.

5. The apparatus of claim 1, further comprising:
   a sealing layer positioned on the silicon substrate, wherein the sealing layer and the silicon substrate together encapsulate the microfluidic channel.

6. The apparatus of claim 5, wherein the sealing layer is positioned on a first side of the silicon substrate, wherein the through-silicon via extends from a second side of the silicon substrate towards the pattern of material and wherein the first side is opposite the second side.

7. The apparatus of claim 1, wherein the pattern of material divides an area of the silicon substrate into a plurality of sectors.

8. A computer-implemented method, comprising:
   capturing, by a system operably coupled to a processor, an image of a first surface of a substrate; and
   comparing, by the system, the image to a reference image of a pattern of material to determine a formation progress of a via formed into the substrate, wherein the via extends from a second surface of the substrate towards the first surface.

9. The computer-implemented method of claim 8, further comprising:
   determining, by the system, that the pattern of material is absent from the first surface based on the comparing; and
   determining, by the system, that the via is a fully formed via based on the determining that the pattern of material is absent from the first surface.

10. The computer-implemented method of claim 8, further comprising:
    determining, by the system, that the pattern of material is at least partially present on the first surface based on the comparing; and
    determining, by the system, that the via is a partially formed via based on the determining that the pattern of material is at least partially present on the first surface.

11. The computer-implemented method of claim 10, further comprising:
    etching the via to increase a dimension of the via.

12. The computer-implemented method of claim 8, wherein the substrate is a silicon substrate, wherein the pattern of material is a pattern of silicon material, and wherein the via is a silicon-through via.

13. A method, comprising:
    identifying a location on a substrate where a via will be formed; and
    fabricating a pattern of material at the location to form an etch check, wherein a presence of the etch check on the substrate subsequent to an etching of the via into the substrate indicates that the via is partially etched.

14. The method of claim 13, wherein the etch check is confined within the location on the substrate where the via will be formed.

15. The method of claim 14, wherein an edge contour of the pattern of material visually distinguishes the pattern of material from the substrate.

16. The method of claim 13, further comprising:
    lithographically defining the pattern of material in relief from the substrate, wherein the substrate is a silicon substrate, and wherein the via is a through-silicon via.

17. The method of claim 13, further comprising:
    etching the pattern of material into the substrate, wherein the substrate is a silicon substrate, and wherein the via is a through-silicon via.

18. The method of claim 13, further comprising:
    optically inspecting the location on the substrate subsequent to the etching of the via to determine whether the etch check is present on the substrate.

* * * * *